United States Patent
Kobayashi et al.

(10) Patent No.: US 10,014,776 B2
(45) Date of Patent: Jul. 3, 2018

(54) POWER CONVERSION DEVICE AND METHOD FOR DIAGNOSING ABNORMALITY IN VOLTAGE SENSOR CHARACTERISTICS

(71) Applicant: Mitsubishi Electric Corporation, Tokyo (JP)

(72) Inventors: Masaru Kobayashi, Tokyo (JP); Shinsuke Idenoue, Tokyo (JP); Satoshi Ishii, Tokyo (JP); Kazuhiko Otsuka, Tokyo (JP); Junichi Abe, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/449,191

(22) Filed: Mar. 3, 2017

(65) Prior Publication Data
US 2018/0026539 A1   Jan. 25, 2018

(30) Foreign Application Priority Data
Jul. 19, 2016   (JP) .................... 2016-141340

(51) Int. Cl.
*B60L 1/00*         (2006.01)
*H02M 3/158*     (2006.01)
(Continued)

(52) U.S. Cl.
CPC .......... *H02M 3/158* (2013.01); *G01R 19/003* (2013.01); *G01R 19/165* (2013.01); *H02M 7/537* (2013.01); *H02P 27/00* (2013.01)

(58) Field of Classification Search
CPC ........ H02M 7/42; H02M 7/53; H02M 7/5387; H02M 7/53871; H02M 7/537; H02H 7/1222; H02H 7/1227; B60R 16/03
(Continued)

(56) References Cited

U.S. PATENT DOCUMENTS 7,821,214 B2 * 10/2010 Yaguchi ................. B60K 6/445
                                                                        307/9.1
2010/0213904 A1 * 8/2010 Yamada ................. B60L 3/003
                                                                        320/166
(Continued)

FOREIGN PATENT DOCUMENTS

JP   2007-282299 A   10/2007
JP   2010-008153 A   1/2010
(Continued)

OTHER PUBLICATIONS

JP 2015/033153 (A) English Translation.*

*Primary Examiner* — Alex Torres-Rivera
(74) *Attorney, Agent, or Firm* — Sughrue Mion, PLLC; Richard C. Turner

(57) ABSTRACT

A power conversion device provided with a DC power source, a voltage boost converter, an inverter, a primary smoothing capacitor, a secondary smoothing capacitor, an intermediate capacitor provided in the voltage boost converter and three voltage sensors which measure the voltages of the capacitors, further including an abnormality diagnosis controller which makes a diagnosis of the presence/absence of an abnormality in the detection characteristics of the voltage sensors, on the basis of the state of transition of the detection results of the voltage sensors which are monitored during a discharge operation by the respective capacitors.

13 Claims, 3 Drawing Sheets

(51) Int. Cl.
   *H02M 7/537*     (2006.01)
   *H02P 27/00*     (2006.01)
   *G01R 19/00*     (2006.01)
   *G01R 19/165*    (2006.01)

(58) Field of Classification Search
   USPC ..... 363/55, 56.01, 56.02, 57, 58, 65, 95, 96,
                 363/97, 98, 120, 131, 132, 135, 136, 137;
                                       307/9.1, 10.1, 10.7
   See application file for complete search history.

(56) References Cited

U.S. PATENT DOCUMENTS

| | | | | |
|---|---|---|---|---|
| 2012/0187756 | A1* | 7/2012 | Yanagisawa | B60L 11/005 |
| | | | | 307/9.1 |
| 2015/0108929 | A1* | 4/2015 | Nobe | H02P 6/085 |
| | | | | 318/400.3 |
| 2015/0263624 | A1* | 9/2015 | Nobe | H02M 1/32 |
| | | | | 323/299 |
| 2015/0291053 | A1* | 10/2015 | Sato | B60L 11/1872 |
| | | | | 307/10.1 |
| 2015/0321574 | A1* | 11/2015 | Shohei | B60L 3/0007 |
| | | | | 307/10.1 |
| 2017/0005591 | A1* | 1/2017 | Tamura | H02M 1/14 |
| 2017/0267103 | A1* | 9/2017 | Nomura | B60L 3/04 |

FOREIGN PATENT DOCUMENTS

| | | | |
|---|---|---|---|
| JP | 2015-033153 A | | 2/2015 |
| JP | 2015033153 A | * | 2/2015 |

\* cited by examiner

POWER CONVERSION DEVICE AND METHOD FOR DIAGNOSING ABNORMALITY IN VOLTAGE SENSOR CHARACTERISTICS

BACKGROUND OF THE INVENTION

1. Field of the Invention

The present invention relates to a power conversion device provided with a voltage boost converter and an inverter, and more particularly, to a power conversion device which diagnoses the presence or absence of a failure in the voltage detection function of the voltage sensor, and a method for diagnosing an abnormality in the voltage sensor characteristics, on the basis of monitoring results of the voltage detection values of a plurality of voltage sensors which are used for voltage conversion control.

2. Description of the Related Art

A power conversion device having a DC/DC voltage conversion function is generally provided with a voltage sensor which monitors a plurality of voltages including an input voltage and an output voltage, and voltage conversion control is carried out by using the signal detected by these voltage sensors.

If there is a failure in the voltage detection function of the voltage sensors, then an operation such as stopping the converter operation is carried out. A method commonly used for failure detection is one in which the presence or absence of an abnormality in the voltage detection function is diagnosed while applying a certain voltage (see, for example, Japanese Patent Application Publication No. 2010-008153 and Japanese Patent Application Publication No. 2007-282299).

SUMMARY OF THE INVENTION

The prior art involves the following problems, however.

The method disclosed in Japanese Patent Application Publication No. 2010-008153 determines that the voltage detection function has failed, when an abnormal voltage is applied from an external source but an abnormality is not determined. This method, however, requires means for generating an abnormal voltage from an external source and, moreover, does not diagnose the voltage detection function directly. Therefore, Japanese Patent Application Publication No. 2010-008153 has a problem in that the diagnosis accuracy is poor.

The method described in Japanese Patent Application Publication No. 2007-282299 calculates a motor output from two different parameters and determines a failure of the voltage detection function from the deviation in the calculation result. However, this method does not diagnose the voltage detection function by direct calculation. Therefore, Japanese Patent Application Publication No. 2007-282299 also has a problem in that the diagnosis accuracy is poor.

The present invention has been devised in view of the conventional problems described above, an object thereof being to achieve a power conversion device and a method for detecting an abnormality in voltage sensor characteristics, with which the presence/absence of an abnormality in a voltage detection function of a voltage sensor can be diagnosed in a broad voltage range, easily and inexpensively by a simple configuration, and it can be diagnosed with high accuracy whether or not unexpected variation has occurred in the detection characteristics of the voltage sensor.

The power conversion device according to the present invention is a power conversion device, provided with: a voltage boost converter which performs DC/DC conversion of a DC voltage supplied from a DC power source and outputs a boosted DC voltage by switching of a first power semiconductor element group; an inverter which is connected to a subsequent stage of the voltage boost converter, performs DC/AC conversion of the boosted DC voltage by switching of a second power semiconductor element group, and outputs an AC voltage; a primary smoothing capacitor which is connected between the DC power source and the voltage boost converter and smoothens the DC voltage supplied to the voltage boost converter; a secondary smoothing capacitor which is connected between the voltage boost converter and the inverter and smoothens the boosted DC voltage supplied to the inverter; an intermediate capacitor provided inside the voltage boost converter; a primary-side voltage sensor which measures the voltage of the primary smoothing capacitor; a secondary-side voltage sensor which measures the voltage of the secondary smoothing capacitor; and an intermediate voltage sensor which measures the voltage of the intermediate capacitor; further including an abnormality diagnosis controller which carries out a process of measuring a detected voltage value of each of the three voltage sensors, i.e. the primary-side voltage sensor, the secondary-side voltage sensor and the intermediate voltage sensor, and selecting detected voltage values of two of the three voltage sensors, multiple times over the passage of time during implementation of an operation of discharging electrical charge inside the primary smoothing capacitor and electrical charge inside the secondary smoothing capacitor, and makes a diagnosis of the presence/absence of an abnormality in detection characteristics of the three voltage sensors on the basis of comparison results of the detected voltage values of the two voltage sensors.

Furthermore, the method for diagnosing an abnormality in voltage sensor characteristics according to the present invention is a method for diagnosing an abnormality in voltage sensor characteristics implemented in an abnormality diagnosis controller of a power conversion device provided with: a voltage boost converter which performs DC/DC conversion of a DC voltage supplied from a DC power source and outputs a boosted DC voltage by switching of a first power semiconductor element group; an inverter which is connected to a subsequent stage of the voltage boost converter, performs DC/AC conversion of the boosted DC voltage by switching of a second power semiconductor element group, and outputs an AC voltage; a primary smoothing capacitor which is connected between the DC power source and the voltage boost converter and smoothens the DC voltage supplied to the voltage boost converter; a secondary smoothing capacitor which is connected between the voltage boost converter and the inverter and smoothens the boosted DC voltage supplied to the inverter; an intermediate capacitor provided inside the voltage boost converter; a primary-side voltage sensor which measures the voltage of the primary smoothing capacitor; a secondary-side voltage sensor which measures the voltage of the secondary smoothing capacitor; an intermediate voltage sensor which measures the voltage of the intermediate capacitor; and an abnormality diagnosis controller which makes a diagnosis of the presence/absence of an abnormality in detection characteristics of the three voltage sensors, i.e. the primary-side voltage sensor, the secondary-side voltage sensor and the intermediate voltage sensor; wherein the method includes: a first step of halting switching operations of the voltage boost converter and the inverter; a second step of disconnecting the DC power source which is supplied to the voltage boost converter; a third step of implementing a discharge operation based on control of the voltage boost converter and a discharge operation based on control of the inverter, and measuring a detected voltage value of each of the three voltage sensors, i.e. the primary-side voltage sensor, the secondary-side voltage sensor and the intermediate voltage sensor; a fourth step of successively sampling and gathering the detected voltage values of the three voltage sensors during the discharge operation based on control of the inverter, upon halting the discharge operation based on control of the voltage boost converter when the deviation in the detected voltage values of two voltage sensors selected from among the three voltage sensors becomes equal to or lower than a predetermined deviation threshold value, and selecting and successively storing, in a storage unit, the detected voltage values of the two voltage sensors which indicate a maximum value and a minimum value, among the three voltage sensors, for each successive sampling; a fifth step of halting the discharge operation based on control of the inverter, when all of the detected voltage values of the three voltage sensors which are successively gathered in the fourth step become less than a predetermined threshold value; and a sixth step of making a diagnosis of the presence/absence of an abnormality in the detection characteristics of the three voltage sensors, on the basis of comparison results between the deviation between the maximum value and the minimum value successively stored in the storage unit during implementation of the fourth step, and a predetermined determination threshold value.

According to the present invention, a configuration is achieved in which it is possible to make a diagnosis of the presence/absence of an abnormality in the detection characteristics of a voltage sensor, from the state of transition in detection results from each voltage sensor as monitored during a discharge operation. Therefore, it is possible to achieve a power conversion device and a method for detecting an abnormality in voltage sensor characteristics, whereby the presence/absence of an abnormality in a voltage detection function of a voltage sensor can be diagnosed in a broad voltage range, easily and inexpensively by a simple configuration, and it can be diagnosed with high accuracy whether or not unexpected variation has occurred in the detection characteristics of the voltage sensors.

DESCRIPTION OF THE PREFERRED EMBODIMENTS

A power conversion device and a method for diagnosing an abnormality in voltage sensor characteristics according to the first and second embodiments of the present invention are now described in detail with reference to FIGS. 1 to 3.

First Embodiment

Figure 1:
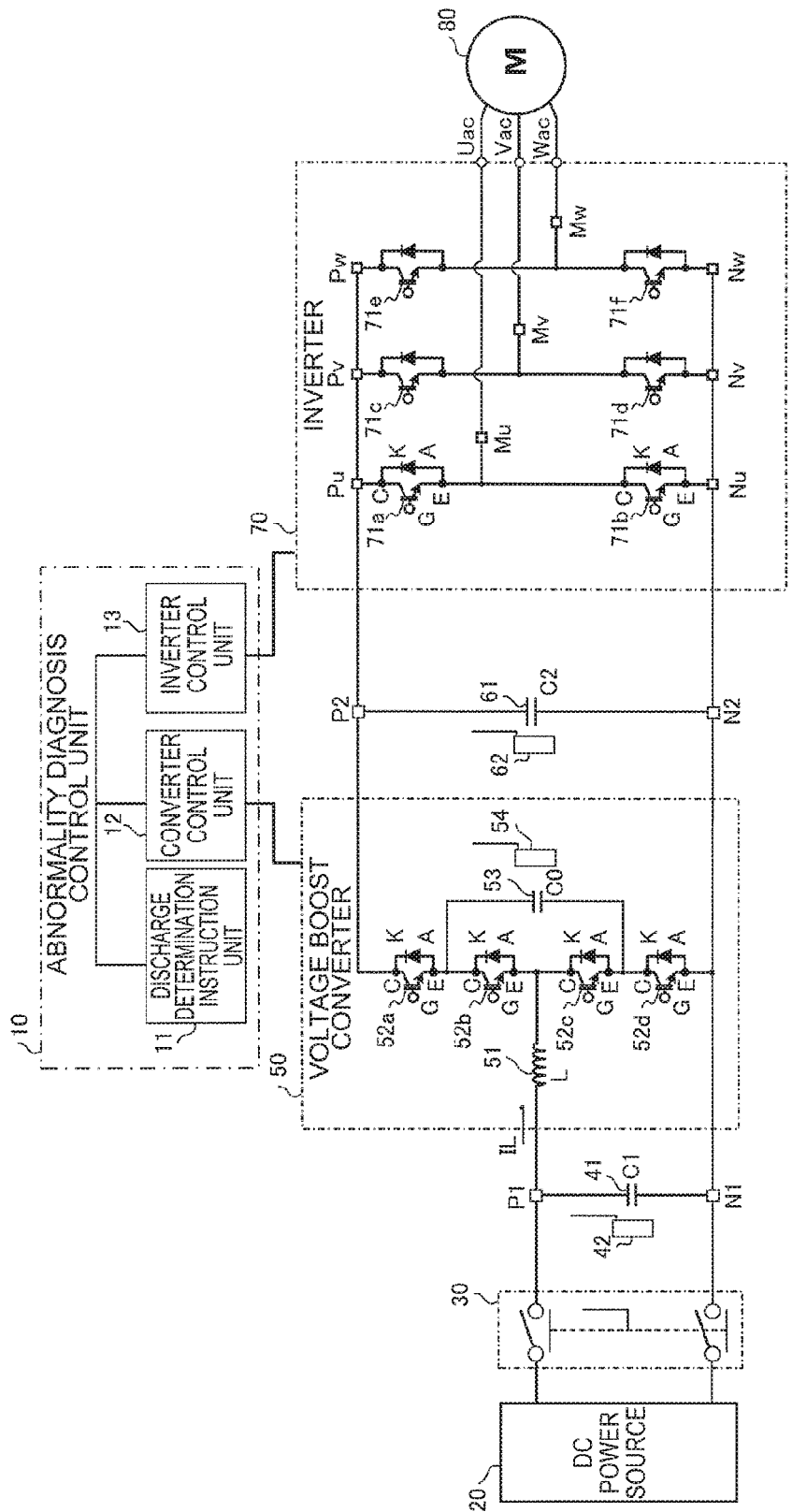
FIG. 1 is a schematic drawing showing a power conversion device relating to the first and second embodiments of the present invention.

FIG. 1 is a schematic drawing showing a power conversion device relating to the first embodiment of the present invention. The power conversion device illustrated in FIG. 1 comprises an abnormality diagnosis control unit 10 (an abnormality diagnosis controller 10), a DC power source 20, a relay 30, a primary smoothing capacitor 41, a primary-side voltage sensor 42, a voltage boost converter 50, a secondary smoothing capacitor 61, a secondary-side voltage sensor 62, an inverter 70 and an electric motor 80.

The DC power source 20 is chargeable/dischargeable, and exchanges power with the electric motor 80 via the voltage boost converter 50 and the inverter 70.

The voltage boost converter 50 is connected between the DC power source 20 and the inverter 70. The voltage boost converter 50 is configured from a reactor 51, semiconductor switch elements 52*a* to 52*d*, and an energy transfer capacitor 53.

In the description given below, the energy transfer capacitor 53 is called an "intermediate capacitor 53". Furthermore, the semiconductor switch elements 52*a* to 52*d* in the voltage boost converter 50 correspond to a first power semiconductor element group.

The voltage boost converter 50 which is provided with a configuration of this kind boosts the DC voltage supplied from the DC power source 20 to the primary-side terminals P1, N1, by DC/DC conversion, and outputs the resultant voltage to the secondary-side terminals P2, N2.

Moreover, an intermediate voltage sensor 54 which measures the voltage between a high-voltage node and a low-voltage node of the intermediate capacitor 53 (this voltage is called "voltage value V0" below) is provided in the vicinity of the intermediate capacitor 53.

The primary smoothing capacitor 41 is connected between the DC power source 20 and the voltage boost converter 50, and smoothens the voltage between the DC power source 20 and the voltage boost converter 50. Moreover, a primary-side voltage sensor 42 which measures the voltage between a high-voltage node and a low-voltage node of the primary smoothing capacitor 41 (this voltage is called "voltage value V1" below) is provided in the vicinity of the primary smoothing capacitor 41.

The inverter 70 is configured from semiconductor switch elements 71*a* to 71*f*. The semiconductor switch elements 71*a* to 71*f* in the inverter 70 correspond to a second power semiconductor element group. The inverter 70 which is provided with a configuration of this kind converts the high-voltage DC voltage output from the secondary-side terminals P2, N2 of the voltage boost converter 50, to an AC voltage, by DC/AC conversion.

The secondary smoothing capacitor 61 is connected between the voltage boost converter 50 and the inverter 70 and smoothens the voltage between the voltage boost converter 50 and the inverter 70. A secondary-side voltage sensor 62 which measures the voltage between a high-voltage node and a low-voltage node of the secondary smoothing capacitor 61 (this voltage is called "voltage value V2" below) is provided in the vicinity of the secondary smoothing capacitor 61.

The electric motor 80 is provided with three terminals corresponding to the coil phases: terminal Uac, terminal Vac and terminal Wac. The terminal Uac is connected to a connection node Mu between the semiconductor switch element 71*a* and the semiconductor switch element 71*b* of the inverter 70.

Similarly, the terminal Vac is connected to a connection node Mv between the semiconductor switch element 71*c* and the semiconductor switch element 71*d*, and the terminal Wac is connected to a connection node Mw between the semiconductor switch element 71e and the semiconductor switch element 71f.

The abnormality diagnosis control unit 10 is configured from a discharge determination instruction unit 11, a converter control unit 12 and an inverter control unit 13. In a specific hardware configuration, the abnormality diagnosis control unit 10 is provided with a microcomputer which is not depicted in FIG. 1, and executes the functions of the various component elements.

The abnormality diagnosis control unit 10 is included in an integrated control unit, which is not depicted in FIG. 1. During normal operation, the integrated control unit controls the electric motor 80 in accordance with an input signal, by operation of the microcomputer.

On the other hand, the abnormality diagnosis control unit 10 executes a diagnosis function for verifying an abnormality in the voltage detection characteristics, as described below with reference to FIG. 2, by operation of the microcomputer.

The inverter control unit 13 adjusts the amplitude and frequency of the AC voltage output from the inverter 70, by switching the semiconductor switch elements 71a to 71f in the inverter 70 on and off in accordance with the gate drive signal. In this way, the inverter control unit 13 controls the drive power and braking power of a vehicle, by adjusting the drive power and braking power of the electric motor 80, via the inverter 70.

The relay 30 is set to a closed state during operation of the vehicle, whereby the DC power source 20 is electrically connected to the primary smoothing capacitor 41 and the voltage boost converter 50.

Meanwhile, the relay 30 is set to an open state in the event of a collision of the vehicle, or when the vehicle has stopped operation, whereby the DC power source 20 is electrically disconnected from the primary smoothing capacitor 41 and the voltage boost converter 50.

The open state and closed state of the relay 30 are switched in accordance with an instruction signal which is output from a control unit included in the abnormality diagnosis control unit 10, or an instruction signal which is output from a separate electronic control device (not illustrated).

The discharge determination instruction unit 11 outputs an instruction to discharge the electric charge stored in the primary smoothing capacitor 41, the secondary smoothing capacitor 61 and the intermediate capacitor 53 in the voltage boost converter 50, in the event of a collision of the vehicle or when the power of the vehicle has stopped, with the object of avoiding the risk of electric shock. More specifically, the discharge determination instruction unit 11 executes a discharge operation by outputting a discharge instruction to the converter control unit 12 and the inverter control unit 13.

The converter control unit 12 and the inverter control unit 13 which have received a discharge instruction perform a discharge of the primary smoothing capacitor 41, the secondary smoothing capacitor 61 and the intermediate capacitor 53 in the voltage boost converter 50.

Here, the method of discharging the electrical charge can employ, for example, passive discharge by a discharge resistance or discharge by a switching operation of a semiconductor switch element, as described in Japanese Patent Application Publication No. 2015-033153. Furthermore, the discharge method employed may also be another method apart from this. This point is similar to the second embodiment indicated below.

Furthermore, the discharge determination instruction unit 11 is able to detect "collision of the vehicle" or "stopping of the power" as described above, in the following manner, for example. In other words, the discharge determination instruction unit 11 is able to detect a "collision of the vehicle" from a sudden change in acceleration based on an acceleration sensor, which is not illustrated. Furthermore, the discharge determination instruction unit 11 is able to detect "stopping of the power", when the use of the vehicle has ended and it is detected that the power has stopped.

Next, a method for diagnosing an abnormality in a voltage detection function according to the first embodiment will be described. In a power conversion device which is provided with the configuration in FIG. 1, the converter control unit 12 controls the switching operation of the semiconductor switch elements 52a to 52d in the voltage boost converter 50. Similarly, the inverter control unit 13 controls the switching operation of the semiconductor switch elements 71a to 71f in the inverter 70.

By controlling these switching operations, it is possible to discharge the electrical charge in the primary smoothing capacitor 41, the secondary smoothing capacitor 61 and the intermediate capacitor 53 in the voltage boost converter 50. Furthermore, the voltage values in the respective capacitors 41, 53, 61 is detected by the respective voltage sensors 42, 54, 62.

The abnormality diagnosis control unit 10 in FIG. 1 executes a switching operation suited to the diagnosis of an abnormality in the voltage detection function, and in this case, carries out abnormality diagnosis in each of the voltage sensors on the basis of the transitions in the voltage values of the capacitors which are detected by the respective voltage sensors. FIG. 2 is a flowchart illustrating a processing sequence relating to the method for diagnosing an abnormality in a voltage detection function according to the first embodiment of the present invention.

The abnormality diagnosis control unit 10 also has a microcomputer, as well as being provided with a configuration such as that illustrated in FIG. 1. The description given below in relation to the flowchart in FIG. 2 is simplified by supposing that all of the operations are executed by the abnormality diagnosis control unit 10.

Firstly, in step S101, the abnormality diagnosis control unit 10 stops switching of the voltage boost converter 50 and also stops switching of the inverter 70.

Next, in step S102, the abnormality diagnosis control unit 10 opens the relay 30. Thereby, the DC power source 20 is disconnected electrically from the primary smoothing capacitor 41 and the voltage boost converter 50.

By the processing thus far, the abnormality diagnosis control unit 10 enters into a diagnostic mode for verifying an abnormality in the voltage detection characteristics. Thereupon, in step S103, the abnormality diagnosis control unit 10 respectively acquires the voltage value V0 from the intermediate voltage sensor 54, the voltage value V1 from the primary-side voltage sensor 42, and the voltage value V2 from the secondary-side voltage sensor 62.

In this case, the abnormality diagnosis control unit 10 performs A/D conversion of the acquired three voltage values V0, V1, V2, by substantially simultaneous sampling to acquire the voltage values as numerical data.

Moreover, the abnormality diagnosis control unit 10 uses a conversion table in which individual variations in the voltage sensor circuits are stored as characteristics, to carry out physical quantity conversion of the acquired data from the A/D converted values to voltage values.

As described above, the abnormality diagnosis control unit 10 respectively acquires the voltage values V0 to V2, based on the transmission of electrical signals to the microcomputer. In this, when short circuit, ground fault or disconnection of the signal wire occurs in the transmission path of the electrical signals to the microcomputer, the voltage value which is subjected to physical quantity conversion indicates a markedly high voltage value or low voltage value.

Figure 2:
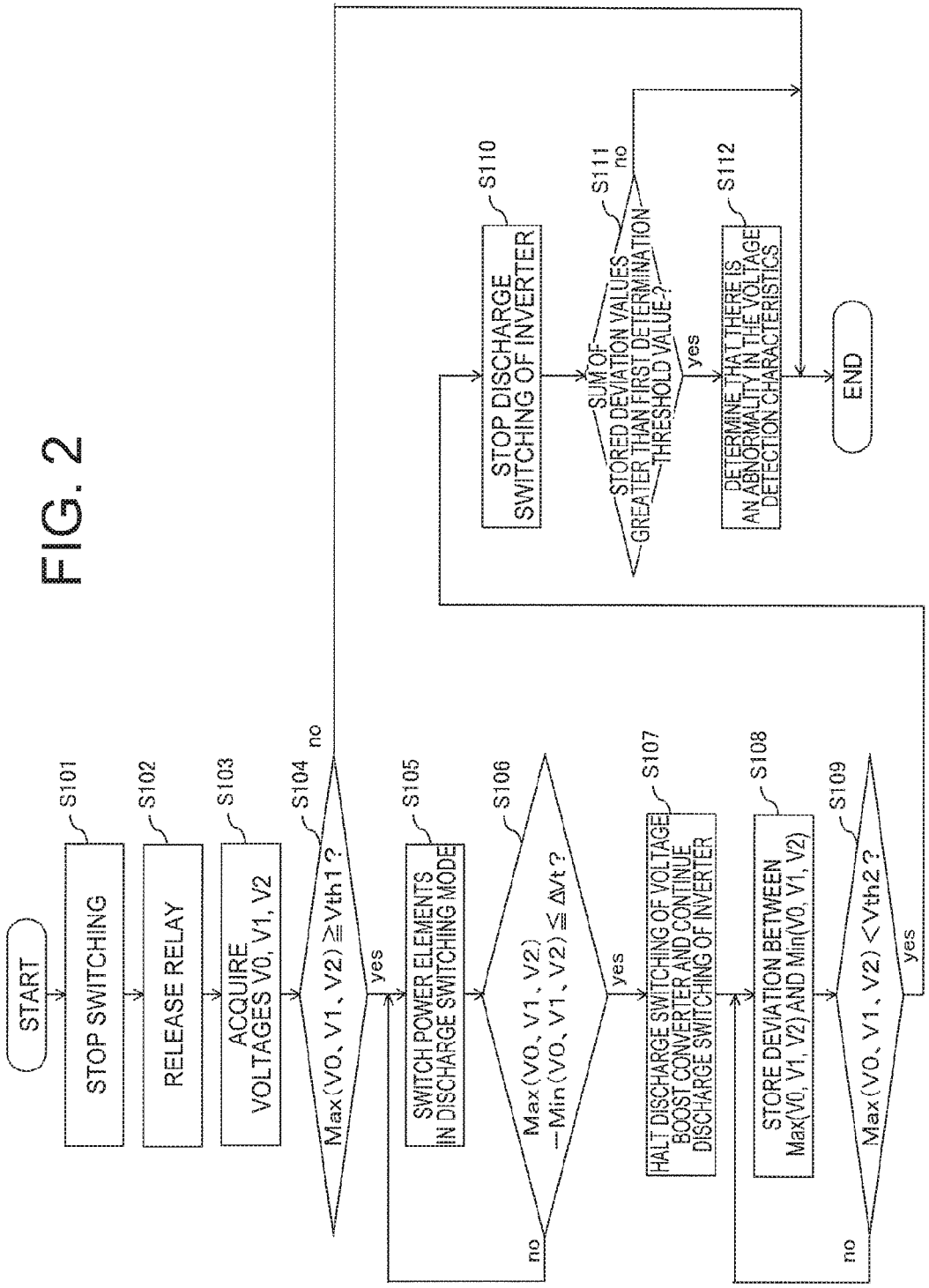
FIG. 2 is a flowchart illustrating a processing sequence relating to the method for diagnosing abnormalities in a voltage detection function according to the first embodiment of the present invention.

In this case, an abnormality such as short circuit, ground fault or disconnection of the signal wire can be identified from the voltage value characteristics, and is detected by a separate abnormality diagnosis processing method to the processing sequence relating to the method for diagnosing an abnormality according to the embodiment of the present invention illustrated in FIG. 2. Therefore, a voltage value abnormality caused by short circuit, ground fault or disconnection of the signal wire in the transmission path of the voltage detection signal to the microcomputer are excluded from the processing sequence described below.

Next, in step S104, the abnormality diagnosis control unit 10 determines whether or not the maximum value of the voltage values V0 to V2 obtained by physical amount conversion is equal to or greater than a predetermined first threshold value Vth1.

If the maximum value of the voltage values V0 to V2 is equal to or greater than the first threshold value Vth1, then the abnormality diagnosis control unit 10 transfers to the processing from step S105 on in order to start discharge of the electrical charge in the capacitors 41, 53, 61. On the other hand, if the maximum value of the voltage values V0 to V2 is less than the first Vth1, then the abnormality diagnosis control unit 10 terminates the processing sequence without discharging electrical charge.

Upon advancing to step S105, the abnormality diagnosis control unit 10 respectively switches the semiconductor switch elements 52a to 52d in the voltage boost converter 50, and the semiconductor switch elements 71a to 71f in the inverter 70, to a discharge switching mode.

Next, in step S106, the abnormality diagnosis control unit 10 determines whether or not the deviation between the maximum value and the minimum value of the voltage values V0 to V2 is equal to or less than a predetermined deviation threshold value $\Delta Vt$. If the determined deviation is equal to or less than the deviation threshold value $\Delta Vt$, then the abnormality diagnosis control unit 10 transfers to the processing from step S107 on. Meanwhile, if the determined deviation is greater than the deviation threshold value $\Delta Vt$, then the abnormality diagnosis control unit 10 repeats the processing in step S105, until the condition in step S106 is established.

Upon advancing to step S107, the abnormality diagnosis control unit 10 stops the discharge switching of the voltage boost converter 50 and continues only the discharge switching of the inverter 70.

Moreover, in step S108, the abnormality diagnosis control unit 10 successively calculates the deviation between the maximum value and minimum value of the voltage values V0 to V2, and stores the deviation in the storage unit, for each predetermined deviation point, and for each predetermined timing.

Subsequently, in step S109, the abnormality diagnosis control unit 10 determines whether or not the maximum value of the voltage values V0 to V2 is less than a second threshold value Vth2 which is set previously as a value equivalent to the voltage at the end of discharge. If the maximum value is less than the second threshold value Vth2, then the abnormality diagnosis control unit 10 transfers to the processing from step S110 on. Meanwhile, if the determined maximum value is equal to or greater than the second threshold value Vth2, then the abnormality diagnosis control unit 10 repeats the processing in step S108, until the condition in step S109 is established.

Upon advancing to step S110, the abnormality diagnosis control unit 10 stops the discharge switching of the inverter 70.

Next, in step S111, the abnormality diagnosis control unit 10 determines whether or not the sum of the deviation stored in the previous step S108 exceeds a predetermined first determination threshold value FTH_Vsns1. If the sum of the stored deviation values exceeds the first determination threshold value FTH_Vsns1, then the abnormality diagnosis control unit 10 advances to step S112 and diagnoses that the voltage detection characteristics are abnormal, then terminates the processing sequence.

On the other hand, if the sum of the stored deviation values does not exceed the first determination threshold value FTH_Vsns1, then the abnormality diagnosis control unit 10 diagnoses that the voltage detection characteristics are normal and terminates the processing sequence.

As described above, according to the first embodiment, the voltage boost converter and the inverter are driven in a discharge switching mode and when diagnosis conditions have been established, a discharge switching mode is continued by the inverter alone. During the continuation of the discharge switching mode by the inverter alone, the presence/absence of an abnormality in the voltage detection function is diagnosed by successively comparing the voltage detection values of the respective capacitors.

As a result of this, it is possible to diagnose the presence/absence of an abnormality in the voltage detection function, with good accuracy, inexpensively and easily, by a simple configuration, in a broad voltage range from a voltage sensor input equivalent to the power source voltage, up to the discharge lower limit. In particular, even if unexpected variation occurs in the detection characteristics of the voltage sensor, it is possible to diagnose the presence/absence of an abnormality in the voltage detection function with high accuracy by carrying out measurement in a broad voltage range during a discharge operation.

Second Embodiment

In the first embodiment above, an abnormality in the voltage detection characteristics is diagnosed by comparing and determining whether or not the sum of stored deviation values exceeds a first determination threshold value. On the other hand, in the second embodiment, an abnormality in the voltage detection characteristics is diagnosed in a simpler fashion, without determining the sum of the stored deviation values.

The configuration of the power conversion device according to the second embodiment is the same as the configuration in FIG. 1 relating to the first embodiment above and description thereof is omitted here. The process for diagnosing the voltage detection characteristics in the second embodiment is described with reference to a flowchart.

Figure 3:
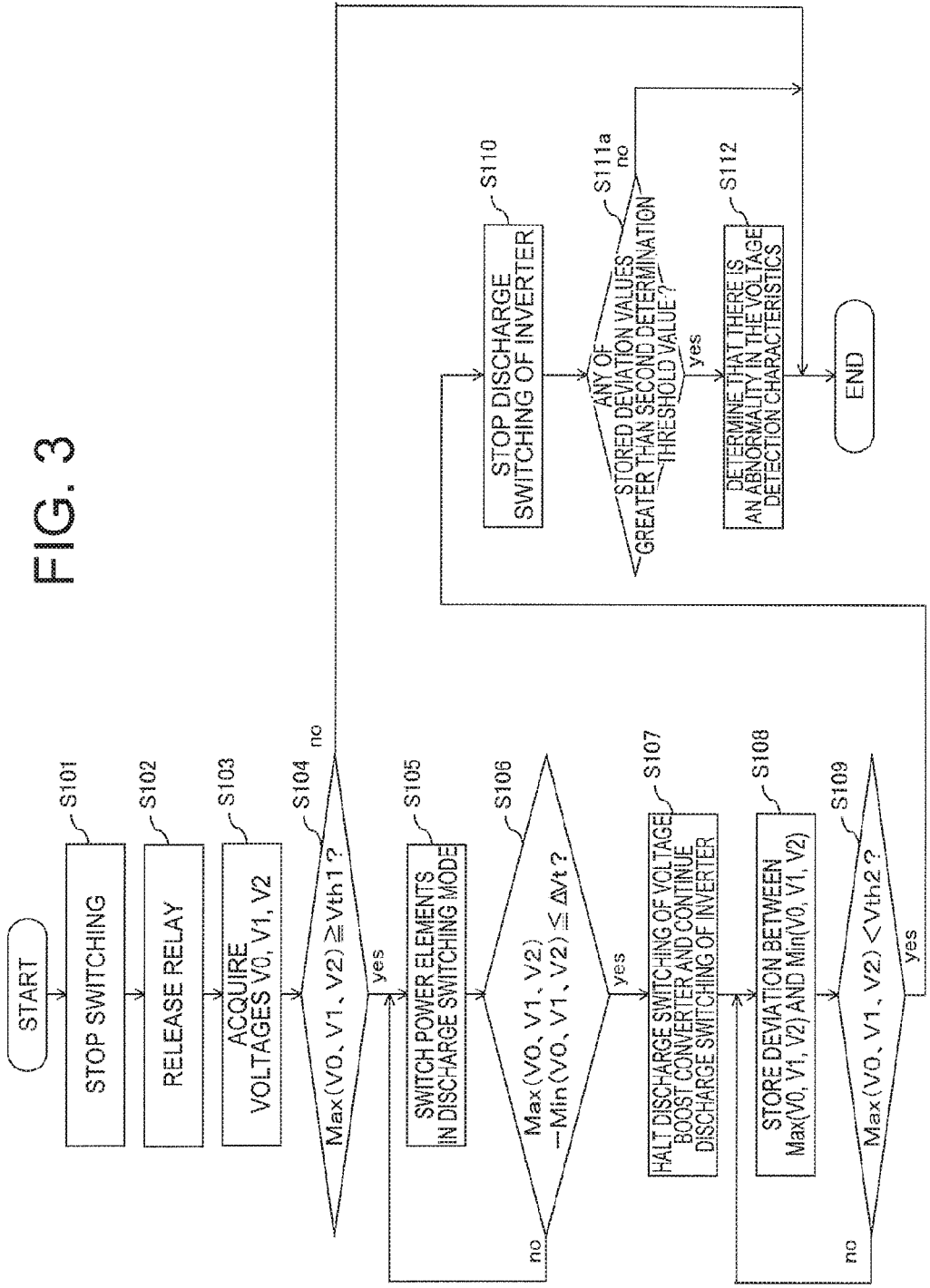
FIG. 3 is a flowchart illustrating a processing sequence relating to the method for diagnosing abnormalities in a voltage detection function according to the second embodiment of the present invention.

FIG. 3 is a flowchart illustrating a processing sequence relating to the method for diagnosing an abnormality in a voltage detection function according to the second embodiment of the present invention. In comparison with FIG. 2, in FIG. 3, steps S101 to S110 and step S112 are the same, and the processing in step S111a is carried out instead of step S111 in FIG. 2. Therefore, the description given below centers on step S111a, which is the point of difference.

In the flowchart in FIG. 3 of the second embodiment, steps S101 to S110 are executed in a similar manner to the flowchart in FIG. 2 relating to the first embodiment above, and the abnormality diagnosis control unit 10 then advances to step S111a.

Next, in step S111a, the abnormality diagnosis control unit 10 determines whether or not the any of the deviation values stored in the previous step S108 exceeds a predetermined second determination threshold value FTH_Vsns2. If any of the stored deviation values exceeds the second determination threshold value FTH_Vsns2, then the abnormality diagnosis control unit 10 advances to step S112 and diagnoses that the voltage detection characteristics are abnormal, and terminates the processing sequence.

On the other hand, if none of the deviation values stored in the storage unit exceeds the second determination threshold value FTH_Vsns2, then the abnormality diagnosis control unit 10 diagnoses that the voltage detection characteristics are normal and terminates the processing sequence.

In this way, according to the second embodiment, the presence/absence of an abnormality in the voltage detection function is diagnosed by determining whether or not any of the stored deviation values exceeds the second determination threshold value, rather than using the sum of the stored deviation values. By processing of this kind, it is also possible to obtain similar beneficial effects to the first embodiment described above.

In the first and second embodiments described above, the deviation is determined by finding the deviation between the maximum value and minimum value of the detection voltage values V0, V1, V2 of each of the three voltage sensors, but the present invention is not limited to calculation of deviation of this kind. By setting a suitable threshold value, it is also possible to carry out diagnosis by using the deviation between the maximum value and the intermediate value, or the deviation between the intermediate value and the minimum value, and similar beneficial effects can be obtained.

Furthermore, according to the present invention, it is possible to diagnose an abnormality over a broad voltage range, from a voltage equivalent to the DC power source voltage to a voltage band below the discharge lower limit. It is not necessary to carry out diagnosis up to the discharge lower limit voltage, and diagnosis may also be carried out up to the lower limit of the normal power conversion operating range, in accordance with the application.

What is claimed is:

1. A power conversion device, comprising:
   a voltage boost converter which performs DC/DC conversion of a DC voltage supplied from a DC power source and outputs a boosted DC voltage by switching of a first power semiconductor element group;
   an inverter which is connected to a subsequent stage of the voltage boost converter, performs DC/AC conversion of the boosted DC voltage by switching of a second power semiconductor element group, and outputs an AC voltage;
   a primary smoothing capacitor which is connected between the DC power source and the voltage boost converter and smoothens the DC voltage supplied to the voltage boost converter;
   a secondary smoothing capacitor which is connected between the voltage boost converter and the inverter and smoothens the boosted DC voltage supplied to the inverter;
   an intermediate capacitor provided inside the voltage boost converter;
   a primary-side voltage sensor which measures a voltage of the primary smoothing capacitor;
   a secondary-side voltage sensor which measures a voltage of the secondary smoothing capacitor;
   an intermediate voltage sensor which measures a voltage of the intermediate capacitor; and
   an abnormality diagnosis controller which:
      carries out a process of measuring a detected voltage value of each of the primary-side voltage sensor, the secondary-side voltage sensor and the intermediate voltage sensor, and selecting detected voltage values of two of the primary-side voltage sensor, the secondary-side voltage sensor and the intermediate voltage sensor, multiple times over a passage of time during implementation of an operation of discharging electrical charge inside the primary smoothing capacitor and electrical charge inside the secondary smoothing capacitor;
      implements the operation of discharging by controlling the switching of the first power semiconductor element group included in the voltage boost converter and the switching of the second power semiconductor element group included in the inverter; and
      upon halting the operation of discharging based on control of the voltage boost converter, makes a diagnosis of a presence or absence of an abnormality in detection characteristics of the primary-side voltage sensor, the secondary-side voltage sensor and the intermediate voltage sensor, based on comparison results of the detected voltage values which are gathered multiple times during the operation of discharging based on control of the inverter.

2. The power conversion device according to claim 1, wherein the abnormality diagnosis controller:
   implements the operation of discharging based on the control of the voltage boost converter and the control of the inverter, in a state in which the DC power source supplied to the voltage boost converter is disconnected; and
   halts the operation of discharging, based on the control of the voltage boost converter, when deviation in the detected voltage values becomes equal to or lower than a predetermined deviation threshold value.

3. The power conversion device according to claim 2, wherein the abnormality diagnosis controller:
   halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;
   calculates, as one of the comparison results, a sum of absolute values of multiple times of deviation in the detected voltage values which are selected the multiple times; and
   determines that there is the abnormality in the detection characteristics when the sum exceeds a predetermined first determination threshold value.

4. The power conversion device according to claim 2, wherein the abnormality diagnosis controller:
   halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;

calculates, as one of the comparison results, an absolute value of the deviation in the detected voltage values which are selected the multiple times, individually for each of the multiple times; and determines that there is the abnormality in the detection characteristics when any of the absolute value of deviation calculated for each of the multiple times exceeds a predetermined first determination threshold value.

5. The power conversion device according to claim 1, wherein the abnormality diagnosis controller:

halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;

calculates, as one of the comparison results a sum of absolute values of multiple times of deviation in the detected voltage values which are selected the multiple times; and determines that there is the abnormality in the detection characteristics when the sum exceeds a predetermined first determination threshold value.

6. The power conversion device according to claim 1, wherein the abnormality diagnosis controller:

halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;

calculates, as one of the comparison results, an absolute value of deviation in the detected voltage values which are selected the multiple times, individually for each of the multiple times; and determines that there is the abnormality in the detection characteristics when any of the absolute value of deviation calculated for each of the multiple times exceeds a predetermined first determination threshold value.

7. A power conversion devise, comprising:

a voltage boost converter which performs DC/DC conversion of a DC voltage supplied from a DC power source and outputs a boosted DC voltage by switching of a first power semiconductor element group;

an inverter which is connected to a subsequent stage of the voltage boost converter, performs DC/AC conversion of the boosted DC voltage by switching of a second power semiconductor element group, and outputs an AC voltage;

a primary smoothing capacitor which is connected between the DC power source and the voltage boost converter and smoothens the DC voltage supplied to the voltage boost converter;

a secondary smoothing capacitor which is connected between the voltage boost converter and the inverter and smoothens the boosted DC voltage supplied to the inverter;

an intermediate capacitor provided inside the voltage boost converter;

a primary-side voltage sensor which measures a voltage of the primary smoothing capacitor;

a secondary-side voltage sensor which measures a voltage of the secondary smoothing capacitor;

an intermediate voltage sensor which measures a voltage of the intermediate capacitor; and an abnormality diagnosis controller which:

carries out a process of measuring a detected voltage value of the primary-side voltage sensor, the secondary-side voltage sensor and the intermediate voltage sensor, and selecting detected voltage values of two of the primary-side voltage sensor, the secondary-side voltage sensor and the intermediate voltage sensor, multiple times over a passage of time during implementation of an operation discharging electrical charge inside the primary smoothing capacitor and electrical charge inside the secondary smoothing capacitor;

implements the operation of discharging by controlling connected or unconnected states of a primary-side discharge resistance which is connected between a positive electrode and a negative electrode of the primary smoothing capacitor, a secondary-side discharge resistance which is connected between a positive electrode and a negative electrode of the secondary smoothing capacitor, and a discharge resistance which is connected between a positive electrode and a negative electrode of the intermediate capacitor; and upon halting the operation of discharging based on control of the voltage boost converter, makes a diagnosis of a presence or absence of an abnormality in detection characteristics of the primary-side voltage sensor, the secondary-side Voltage sensor and the intermediate voltage sensor, based on comparison results of the detected voltage values which are gathered multiple times during the operation of discharging based on control of the inverter.

8. The power conversion device according to claim 7, wherein the abnormality diagnosis controller:

implements the operation of discharging based on the control of the voltage boost converter and the control of the inverter, in a state in which the DC power source supplied to the voltage boost converter is disconnected; and halts the operation of discharging, based on the control of the voltage boost converter, when deviation in the detected voltage values becomes equal to or lower than a predetermined deviation threshold value.

9. The power conversion device according to claim 8, wherein the abnormality diagnosis controller:

halts the operation of discharging based on the control of the inverter, when the detected voltage value, of each of the primary-side voltage sensor, the secondary-side voltage sensor and the intermediate voltage sensor gathered during the operation of discharging based on the control of the inverter, upon halting the operation of discharging based on the control of the voltage boost converter, become less than a predetermined threshold value;

calculates, as one of the comparison results, a sum of absolute values of multiple times of deviation in the detected voltage values which are selected the multiple times; and determines that there is the abnormality in the detection characteristics when the sum exceeds a predetermined first determination threshold value.

10. The power conversion device according to claim 8, wherein the abnormality diagnosis controller:

halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;

calculates, as one of the comparison results an absolute value of deviation in the detected voltage values which are selected the multiple times, individually for each of the multiple times; and determines that there is the abnormality in the detection characteristics when any of the absolute value of deviation calculated for each of the multiple times exceeds a predetermined first determination threshold value.

11. The power conversion device according to claim 7, wherein the abnormality diagnosis controller:

halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;

calculates, as one of the comparison results, a sum of absolute values of multiple times of deviation in the detected voltage values which are selected the multiple times; and determines that there is the abnormality in the detection characteristics when the sum exceeds a predetermined first determination threshold value.

12. The power conversion device according to claim 7, wherein the abnormality diagnosis controller:

halts the operation of discharging based on the control of the inverter, when the detected voltage value of each of the primary-side voltage sensor, the secondary-side voltage sensor and the intermediate voltage sensor gathered during the operation of discharging based on the control of the inverter, upon halting the operation of the discharging based on the control of the voltage boost converter, become less than a predetermined threshold value;

calculates, as one of the comparison results, an absolute value of deviation in the detected voltage values which are selected the multiple times, individually for each of the multiple times; and determines that there is the abnormality in the detection characteristics when any of the absolute value of deviation calculated for each of the multiple times exceeds a predetermined first determination threshold value.

13. A method for diagnosing an abnormality in voltage sensor characteristics implemented in an abnormality diagnosis controller of a power conversion device, the power conversion device comprising:

a voltage boost converter which performs DC/DC conversion of a DC voltage supplied from a DC power source and outputs a boosted DC voltage by switching of a first power semiconductor element group;

an inverter which is connected to a subsequent stage of the voltage boost converter, performs DC/AC conversion of the boosted DC voltage by switching of a second power semiconductor element group, and outputs an AC voltage;

a primary smoothing capacitor which is connected between the DC power source and the voltage boost converter and smoothens the DC voltage supplied to the voltage boost converter;

a secondary smoothing capacitor which is connected between the voltage boost converter and the inverter and smoothens the boosted DC voltage supplied to the inverter;

an intermediate capacitor provided inside the voltage boost converter;

a primary-side voltage sensor which measures a voltage of the primary smoothing capacitor;

a secondary-side voltage sensor which measures a voltage of the secondary smoothing capacitor; and an intermediate voltage sensor which measures a voltage of the intermediate capacitor, wherein the abnormality diagnosis controller makes a diagnosis of a presence or absence of the abnormality in detection characteristics of the primary-side voltage sensor, the secondary-side voltage sensor and the intermediate voltage sensor, and wherein the method comprises:

a first step of halting switching operations of the voltage boost converter and the inverter;

a second step of disconnecting the DC power source which is supplied to the voltage boost converter;

a third step of implementing a discharge operation based on control of the voltage boost converter and a discharge operation based on control of the inverter, and measuring a detected voltage value of each of the primary-side voltage sensor, the secondary-side voltage sensor and the intermediate voltage sensor;

a fourth step of successively sampling and gathering the detected voltage value of each of the primary-side voltage sensor, the secondary-side voltage sensor and the intermediate voltage sensor, during the discharge operation based on the control of the inverter, upon halting the discharge operation based on the control of the voltage boost converter when a deviation in detected voltage values of two of the primary-side voltage sensor, the secondary-side voltage sensor and the intermediate voltage sensor becomes equal to or lower than a predetermined deviation threshold value, and selecting and successively storing, in a storage unit, the detected voltage values which indicate a maximum value and a minimum value, among the primary-side voltage sensor, the secondary-side voltage sensor and the intermediate voltage sensor, for each successive sampling;

a fifth step of halting the discharge operation based on the control of the inverter, when the detected voltage value of each of the primary-side voltage sensor, the secondary-side voltage sensor and the intermediate voltage sensor which are successively gathered in the fourth step become less than a predetermined threshold value; and a sixth step of making the diagnosis of the presence or absence of the abnormality in the detection characteristics based on comparison results between a deviation between the maximum value and the minimum value successively stored in the storage unit during implementation of the fourth step, and a predetermined determination threshold value.

* * * * *